(12) United States Patent  
Stella et al.

(10) Patent No.: US 8,963,303 B2
(45) Date of Patent: Feb. 24, 2015

(54) POWER ELECTRONIC DEVICE

(71) Applicant: STMicroelectronics S.r.l., Agrate Brianza (IT)

(72) Inventors: Cristiano Gianluca Stella, San Gregorio di Catania (IT); Fabio Criscione, Misterbianco (IT); Gaetano Pignataro, Trecastagni (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/182,156

(22) Filed: Feb. 17, 2014

(65) Prior Publication Data

US 2014/0239413 A1 Aug. 28, 2014

(30) Foreign Application Priority Data

Feb. 22, 2013 (IT) .............................. MI2013A0263

(51) Int. Cl.
| | | |
|---|---|---|
| *H01L 23/495* | (2006.01) | |
| *H01L 23/10* | (2006.01) | |
| *H01L 27/02* | (2006.01) | |
| *H01L 23/00* | (2006.01) | |
| *H01L 23/31* | (2006.01) | |

(52) U.S. Cl.
CPC ...... *H01L 27/0251* (2013.01); *H01L 23/49548* (2013.01); *H01L 23/49562* (2013.01); *H01L 23/49575* (2013.01); *H01L 24/34* (2013.01); *H01L 23/3107* (2013.01); *H01L 2224/48247* (2013.01)
USPC ........... 257/675; 257/666; 257/707; 257/713; 257/E23.051

(58) Field of Classification Search
USPC .................. 257/675, 666, 707, 713, E23.051
See application file for complete search history.

(56) References Cited

U.S. PATENT DOCUMENTS

| | | | | |
|---|---|---|---|---|
| 6,072,240 | A * | 6/2000 | Kimura et al. | 257/735 |
| 6,448,645 | B1 * | 9/2002 | Kimura et al. | 257/735 |
| 6,891,265 | B2 * | 5/2005 | Mamitsu et al. | 257/718 |
| 8,188,587 | B2 * | 5/2012 | Jereza | 257/690 |
| 8,513,784 | B2 * | 8/2013 | Lu et al. | 257/666 |
| 2004/0183188 | A1 | 9/2004 | Oohama | |
| 2006/0108700 | A1 | 5/2006 | Nakazawa et al. | |
| 2007/0045785 | A1 * | 3/2007 | Noquil | 257/666 |
| 2007/0210758 | A1 | 9/2007 | Gangstoe et al. | |
| 2008/0023807 | A1 | 1/2008 | Noquil et al. | |
| 2010/0109135 | A1 * | 5/2010 | Jereza | 257/676 |
| 2011/0074007 | A1 * | 3/2011 | Lopez et al. | 257/692 |

OTHER PUBLICATIONS

IT Search Report for IT MI2013A000263 mailed Nov. 18, 2013 (8 pages).

* cited by examiner

*Primary Examiner* — Nitin Parekh
(74) *Attorney, Agent, or Firm* — Gardere Wynne Sewell LLP

(57) ABSTRACT

A device includes a first and second transistors integrated in first and second chips. Each chip has opposed rear and front surfaces, and further has a first conduction terminal and a control terminal on the front surface and a second conduction terminal on the rear surface. The first and second transistors are electrically connected in series by having the first conduction terminals of the first and second transistors be electrically connected. The device includes a common package enclosing the first and second chips, the common package having an insulating body with a mounting surface. A heat sink is also enclosed within the insulating body, the heat sink making electrical contact with the first conduction terminals of the first and second chips on the respective front surfaces, so that the first conduction terminals are electrically connected together through the heat sink.

17 Claims, 15 Drawing Sheets

POWER ELECTRONIC DEVICE

PRIORITY CLAIM

This application claims priority from Italian Application for Patent No. MI2013A000263 filed Feb. 22, 2013, the disclosure of which is hereby incorporated by reference.

TECHNICAL FIELD

The solution in accordance with one or more embodiments of the present invention relates to the field of electronics. More specifically, this solution relates to electronic devices.

BACKGROUND

Electronic devices are commonly used in varied applications. In the particular case of power electronic devices, they are constructed so as to be able to withstand a relatively high operating power (for example, of the order of 100-625 W).

Power electronic devices include electronic power components (such as power transistors and power diodes) which are typically integrated in chips made of semiconductor material. Each chip is then placed in a suitable package, which protects the chip at the same time allowing access to its terminals. The package comprises an insulating body that incorporates the chip. The insulating body exposes various leads, each of which is electrically connected to a corresponding terminal of the chip; typically, the lead is connected to the terminal of the chip with a wire connection technique (wire-bonding), in which a conductive wire is fixed at one end thereof to the lead, and at another end thereof to the terminal of the chip. The leads of the package are used to connect the same (and hence the corresponding terminals of the chip) to external circuits. For this purpose, the electronic device is typically mounted on a Printed Circuit Board (PCB). For example, in Surface Mount Technology (SMT) the leads are temporarily attached, by means of solder pastes, to corresponding conductive tracks of the printed circuit board by means of a slight pressure (pick and place), and are then welded on the same by reflowing.

Power electronic devices are subject to considerable heating during their operation (as they are affected by high currents and/or voltages, of the order of 50-1500V and 0.1-8A, respectively). Therefore, the package of each electronic power device is typically equipped with a heat sink, which presents a large exposed surface on a mounting surface of the insulating body on the printed circuit board; the chip is fixed on the heat sink, so as to facilitate the transfer of heat produced by the same outside of the package (so as to reduce the thermal resistance of the electronic device from its chip to the external environment). The heat sink can also be electrically connected to a terminal of the electronic device integrated in the wafer, so as to act also by the corresponding lead—for example, when the electronic device has a vertical structure with such a terminal formed on a rear surface of the chip that is fixed on the heat sink (while the other terminals of the chip, implemented on a front surface thereof, are connected to the respective leads via conductive wires).

A typical application of power electronic devices is in protection circuits for battery packs. A battery pack includes a plurality of batteries connected between a positive terminal and a negative terminal. In order to protect the battery pack and control the voltages which are established between the positive and negative terminals of the battery pack and the currents that flow to/from these terminals when the battery pack is connected to a load or to a generator, instead of directly connecting the load/generator to the terminals of the battery pack, it is connected to an input/output port coupled to the terminals of the battery pack through a suitable protection circuit. A generic protection circuit for battery groups (from now on simply "protection circuit"), comprises a pair of electronic power switches (for example, power transistors of the MOS type). The power transistors are arranged in series between a terminal of the battery group (for example the positive terminal) and a terminal of the input/output port. Suitably driving control terminals of the power transistors, it is possible to adjust the flow of current to/from the battery pack during charging phases (when the battery pack is connected to a generator) or discharging phases (when the battery pack is connected to a load), and, when necessary, to inhibit the passage of current by electrically insulating the terminals of the battery pack from the input/output port. The two main types of protection circuit provide that the power transistors are NMOS transistors of power connected in common-drain configuration, or that they are power PMOS transistors connected in a common source configuration.

The power transistors are typically integrated into distinct chips (for reasons both technical and economic), which chips are then housed in corresponding packages. Therefore, the protection circuit includes a separate package for each power transistor, which is mounted separately on the printed circuit board (which implements the desired electrical connection between the various power transistors).

These solutions are not however completely satisfactory—for example, as regards their dimensions, their constructive complexity, and their heat dissipation efficiency.

There are additional solutions that provide for a single package for housing two power transistors connected in series. However, currently such solutions are suitable only to pairs formed by power NMOS transistors connected in a common drain configuration, and to pairs formed by an NMOS transistor and a PMOS transistor connected in a common drain configuration.

SUMMARY

In general terms, the solution in accordance with one or more embodiments is based on the idea of housing each pair of PMOS transistors in a single package, exploiting a single heat sink for the electrical connection between the source terminals of the two transistors.

More specifically, one aspect of the solution in accordance with an embodiment provides an electronic device comprising a first transistor integrated in a first chip and a second transistor integrated in a second chip. Each chip has a rear surface and a front surface opposite to each other. Each chip comprises a first conduction terminal and a control terminal of the corresponding transistor on the front surface and a second conduction terminal of the corresponding transistor on the rear surface. The first transistor and the second transistor are connected with the first conduction terminal of the first transistor connected to the first conduction terminal of the second transistor. The electronic device comprises a common package comprising an insulating body having a mounting surface for mounting the package on a substrate. The insulating body encloses the first transistor and the second transistor, and includes a heat sink incorporated in the insulating body in contact with the first conduction terminals of the first and second chips on the respective front surfaces, so that the first conduction terminals are electrically connected together by means of the heat sink.

A further aspect of the solution in accordance with an embodiment provides a protection system for a battery pack comprising such an electronic device.

BRIEF DESCRIPTION OF THE DRAWINGS

The solution in accordance with one or more embodiments, as well as further features and advantages thereof, will be best understood by reference to the following detailed description, given purely by way of indicative and non-limiting example, to be read in conjunction with the accompanying drawings (in which, for simplicity, corresponding elements are indicated with the same or similar references and their explanation is not repeated, and the name of each entity is generally used to denote both its type and its attributes—such as value, content, and representation). In this respect, it is expressly understood that the figures are not necessarily to scale (with some details that may be exaggerated and/or simplified) and that, unless otherwise indicated, they are merely used to conceptually illustrate the described structures and procedures. In particular.

DETAILED DESCRIPTION OF THE DRAWINGS

Figure 1:
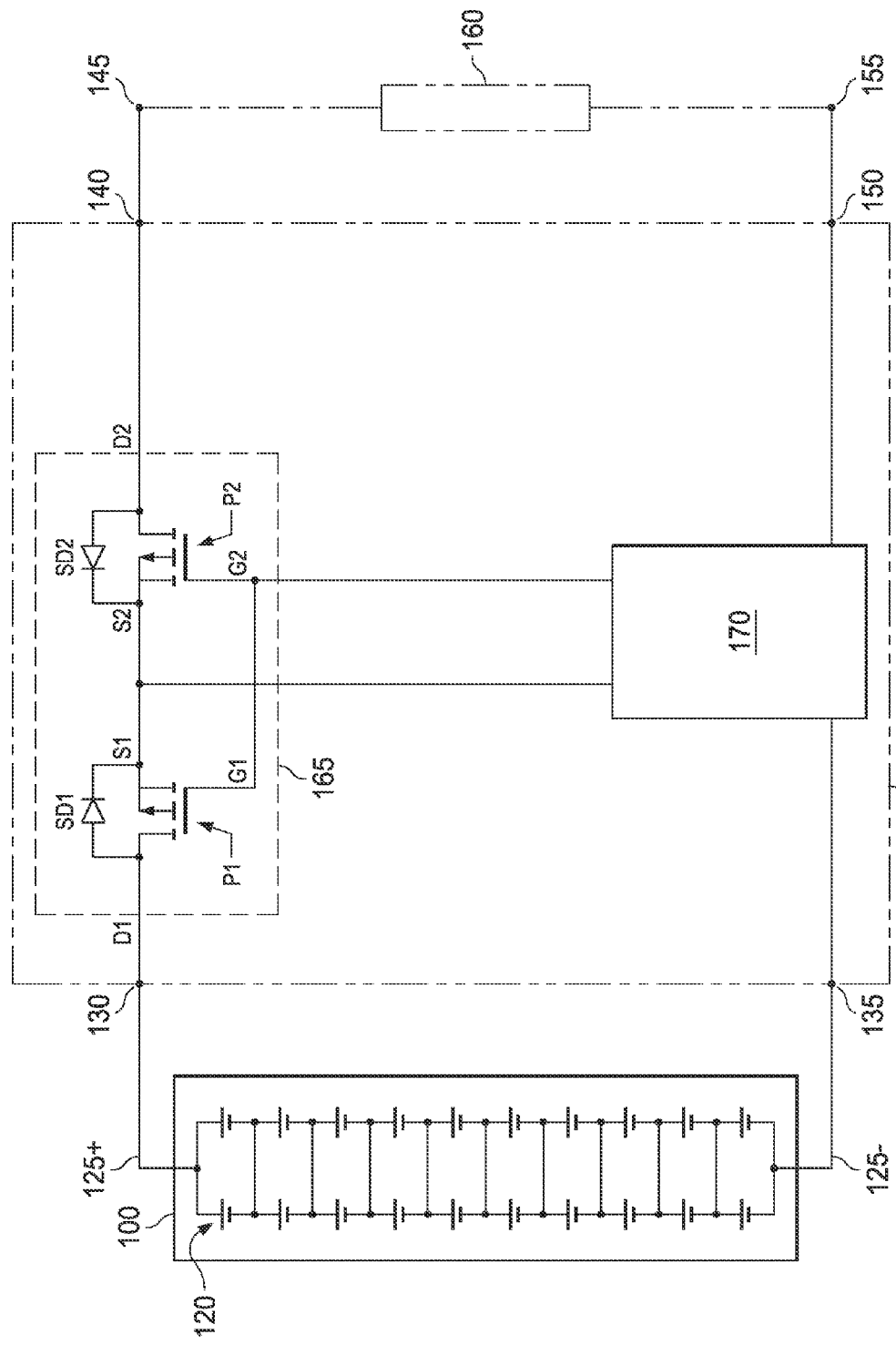
FIG. 1 shows a basic circuit diagram of a battery pack provided with a protection circuit in which the solution in accordance with an embodiment can be used.

With reference in particular to FIG. 1, there is shown a basic circuit diagram of a battery pack 100 provided with a protection circuit 110 in which the solution in accordance with an embodiment can be used.

The battery pack 100 includes a plurality of batteries 120, and has a first terminal 125+ and a second terminal 125−. For example, the first terminal 125+ is the positive terminal of the battery pack 100 while the second terminal 125− is the negative terminal of the battery pack 100.

The protection circuit 110 includes a first port having a first terminal 130 connected to the first terminal 125+ of the battery pack 100 and a second terminal 135 connected to the second terminal 125− of the battery pack 100, and a second port comprising a first terminal 140 connected to a first terminal 145 of an input/output port and a second terminal 150 connected to a second terminal 155 of the input/output port. The battery pack 100 may be coupled to a circuit element 160, such as a load or a generator voltage, by connecting this circuit element 160 between the first terminal 145 and the second terminal 155 of the input/output port.

The protection circuit 110 includes a switch circuit 165 comprising a first power PMOS transistor P1 and a second power PMOS transistor P2 connected in series in a common source configuration between the terminal 130 of the first port of the protection circuit 110 and the terminal 140 of the second port of the protection circuit 110, and driven by a driver circuit 170. In particular, the first transistor P1 has a drain terminal D1 connected to the terminal 130 of the first port of the protection circuit 110, a source terminal S1 connected to a source terminal S2 of the second transistor P2, and a gate terminal connected to the driver circuit 170. The first transistor P1 further comprises a substrate diode SD1 connected between the drain terminal d1 (anode) and the source terminal S1 (cathode). The second transistor P2 also has a drain terminal D2 connected to the terminal 140 of the second port of the protection circuit 110 and a gate terminal G2 connected to the gate terminal G1 of the first transistor P1. The second transistor P2 further comprises a substrate diode SD2 connected between the drain terminal D2 (anode) and the source terminal S2 (cathode).

In a charging mode of the battery pack 100, a voltage generator is connected between the first terminal 145 and the second terminal 155 of the input/output port, and the driver circuit 170 drives the gate terminals G1 and G2 of the transistors P1 and P2 so that the voltages between the source S1 and gate G2 of the transistor P1 and between the source S2 and gate G2 of the transistor P2 are greater than zero. In this condition, a current supplied from the generator flows from terminal 145, crosses the substrate diode SD2, crosses the transistor P1 from the source terminal S1 to the drain terminal D1, and reaches the battery pack 100, loading the batteries 120.

In a discharge mode of the battery pack 100, a load is connected between the first terminal 145 and the second terminal 155 of the input/output port, and the driver circuit 170 drives the gate terminals G1 and G2 of the transistors P1 and P2 so that the voltages between the source S1 and gate G2 of the transistor P1 and between the source S2 and gate G2 of the transistor P2 are greater than zero. In this condition, a current supplied by the battery pack 100 flows from the first terminal 125+ of the battery pack, crosses the substrate diode SD1, crosses the transistor P2 from the source terminal S2 to the drain terminal D2, and reaches the load, supplying it.

In a protection mode, the driver circuit 170 drives the gate terminals G1 and G2 of the transistors P1 and P2 so that the voltages between the source S1 and gate G2 of the transistor P1 and between the source S2 and gate G2 of the transistor P2 are lower than zero. In this situation, both of the transistors P1 and P2 are turned off, and the battery pack 100 results to be isolated from the input/output port.

In accordance with an embodiment, the switch circuit 165 comprising the transistors P1 and P2 connected in a common source configuration is implemented as a single electronic device.

Figure 2A:
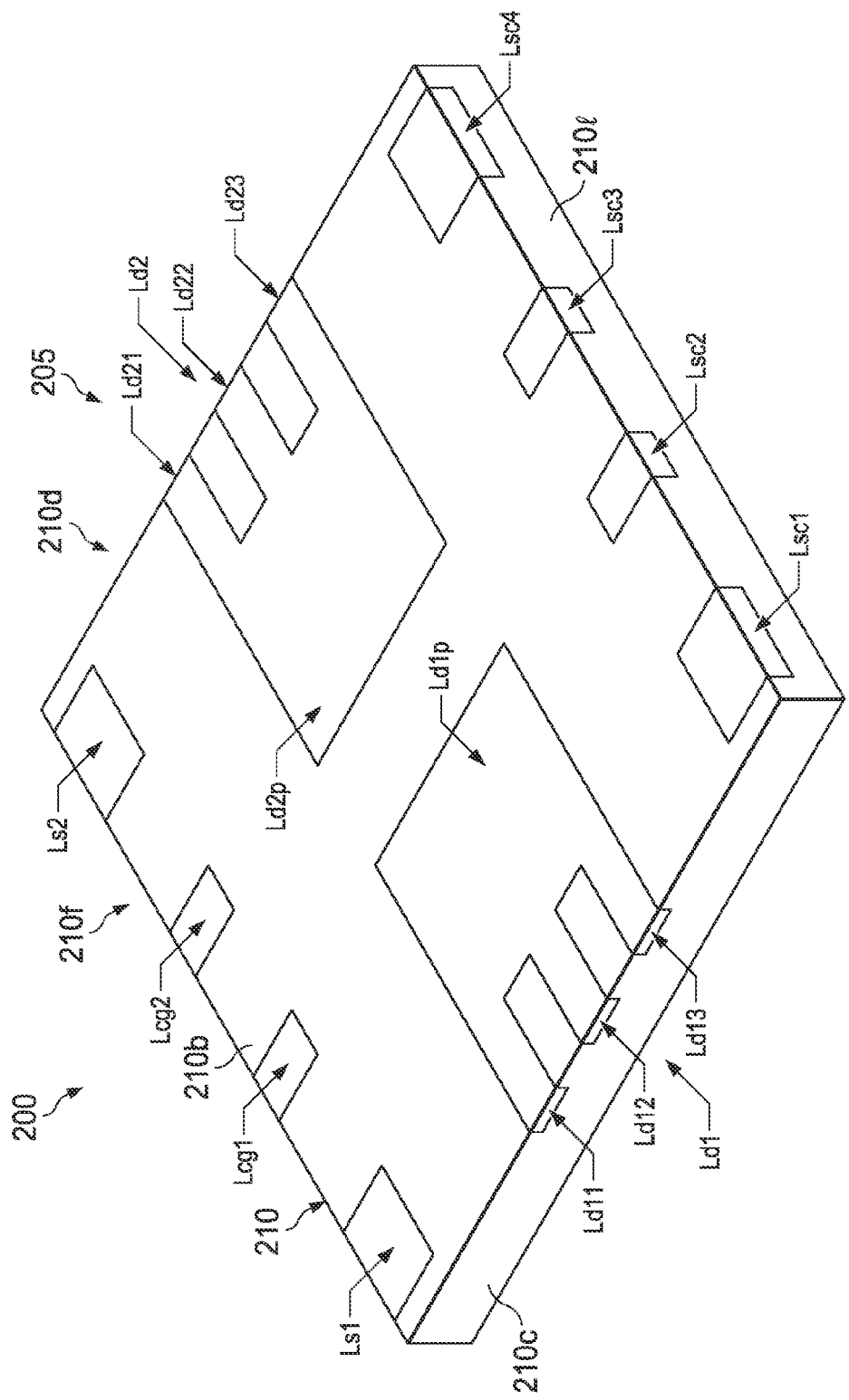
FIG. 2A shows a perspective view of an overturned electronic device in accordance with an embodiment.

A schematic overall view of an electronic device in accordance with one embodiment that can be used in the protection circuit 110 as the switch circuit 165 is shown in FIG. 2A with the reference 200. In particular, FIG. 2A shows a perspective view of the electronic device 200 upside down.

The electronic device 200 comprises a package 205, which protects the transistor P1 and the transistor P2 (not shown in the figure) at the same time allowing access to their terminals. The package 205 is formed from an electrically insulating body 210 (e.g., plastic), generically in the shape of a parallelepiped, which incorporates the transistors P1 and P2. For example, the insulating body 210 has a width of 3-6 mm, a length of 3-8 mm, and a height of 0.8 to 2 mm—such as a width of 5 mm, a length of 6 mm and a thickness of 1 mm, a width of 3.3 mm, a length of 3.3 mm and a thickness of 1 mm, or a width of 5 mm, a length of 5 mm and a thickness of 1 mm.

The insulating body 210 exposes leads, each of which is electrically connected to a terminal (or more terminals) of one or both of the transistors P1 and P2, and is made of electrically conductive material (e.g., metallic material).

In particular, a first drain lead Ld1 electrically connected to the drain terminal D1 of the transistor P1 comprises a pad Ld1p having a generically rectangular shape (which also acts as a heat sink, as described below) which extends over approximately a third of a half of a (rear) mounting surface 210b of the insulating body 210, while a second drain lead Ld2 electrically connected to the drain terminal D2 of the transistor P2 includes a pad Ld2p having a generically rectangular shape (which also acts as a heat sink) which extends over approximately one third of the other half of the mounting surface 210b of the insulating body 210. The first drain lead Ld1 further comprises extension elements (three in the figure) Ld11, Ld12, Ld13 formed by pads having a generally square shape which extend from the pad Ld1p half on the mounting surface 210b and half on a first side surface 210c of the insulating body 210 adjacent to it. Similarly, the second drain lead Ld2 further comprises extension elements (three in the figure) Ld21, Ld22, Ld23 formed by platforms having a generally square shape which extend from the pad Ld2p half on the mounting surface 210b and half on a second side surface 210d (not visible in the figure) of the insulating body 210 adjacent thereto and opposite to the first side surface 210c. Four common source leads Lsc1, Lsc2, Lsc3 Lsc4 electrically connected to both the source terminals S1 and S2 of both transistors P1 and P2 are uniformly distributed along an edge of the mounting surface 201b between the mounting surface 210b and a third lateral surface 210e of the insulating body 210 adjacent to it. Each common source lead Lsc1, Lsc2, Lsc3 and Lsc4 is formed by a pad having a generically square shape which extends half on the mounting surface 210b and half on the third lateral surface 210e. A first source lead Ls1 electrically connected to the source terminal S1 of the transistor P1 and a second source lead Ls2 electrically connected to the source terminal S2 of the transistor P2 are distributed on opposite ends along an edge of the mounting surface 201b between the mounting surface 210b and a fourth side surface 210f of the insulating body 210 adjacent thereto and opposite to the third side surface 210e. Each source lead Ls1, Ls2 is formed by a pad having a generically square shape which extends half on the mounting surface 210b and half on the fourth side surface 210f. Two common gate leads Lcg1 Lcg2 electrically connected to both the gate terminals G1 and G2 of both transistors P1 and P2 are located along the edge of the mounting surface 201b between the mounting surface 210b and the fourth side surface 210f between the source leads Ls1 and Ls2. Each common gate lead Lcg1, Lcg2 is formed by a pad having a generically square shape which extends half on the mounting surface 210b and one half on the fourth side surface 210f.

Figure 2B:
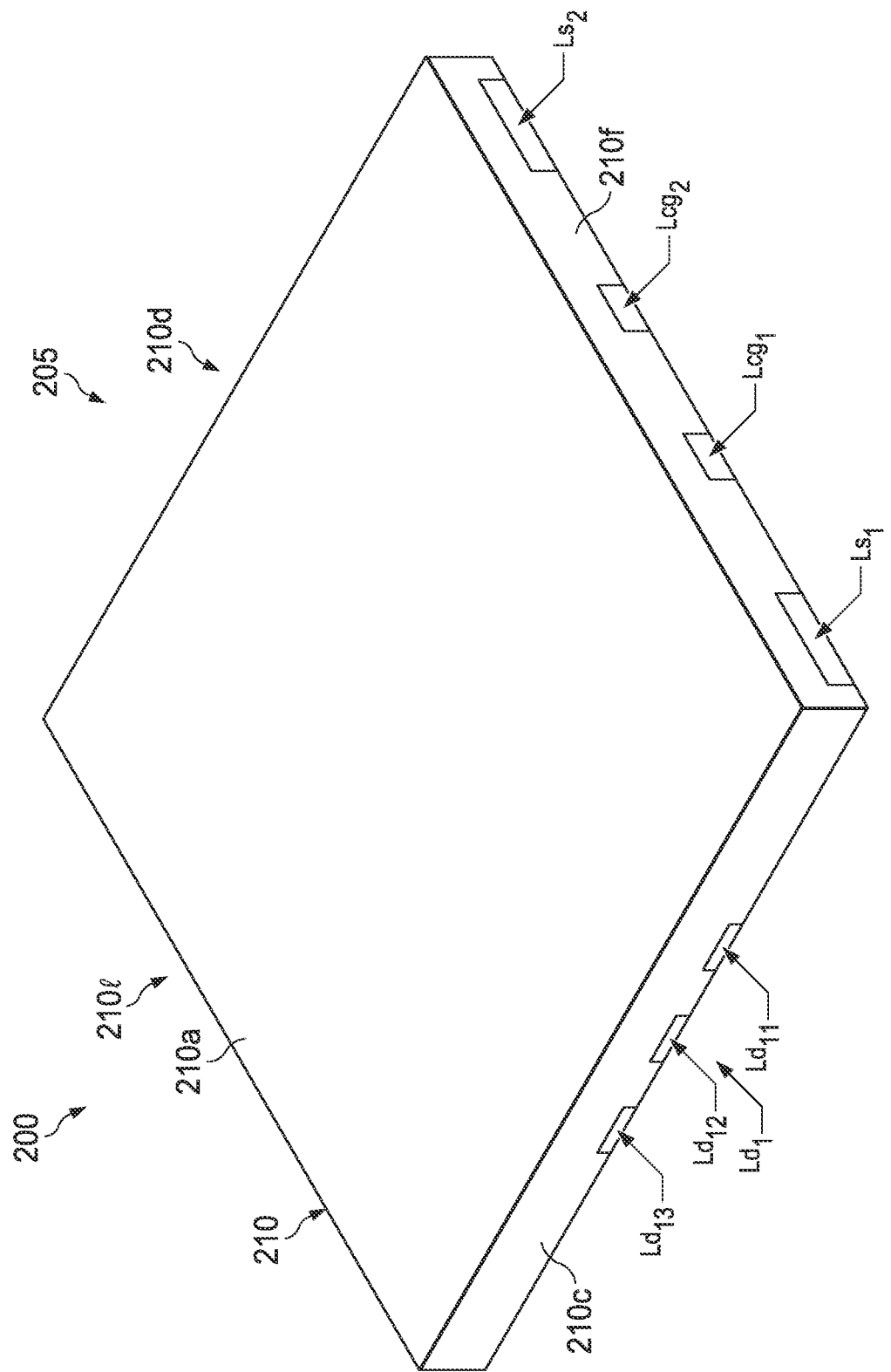
FIG. 2B shows a perspective view from above of the electronic device of FIG. 2A in accordance with an embodiment.
Figure 2C:
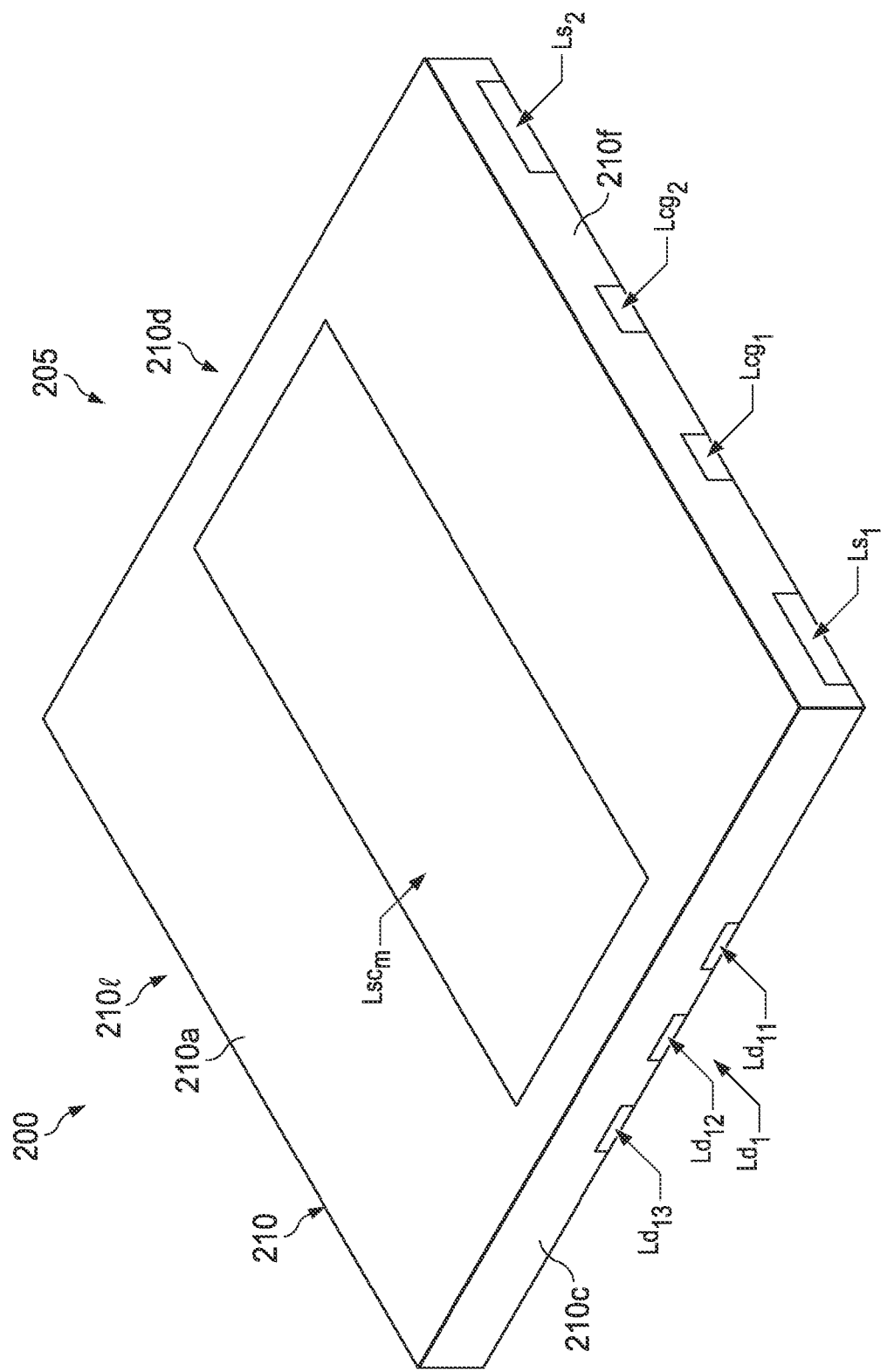
FIG. 2C shows a perspective view from above of the electronic device of FIG. 2A in accordance with a further embodiment.

FIGS. 2B and 2C show a perspective view of the electronic device 200 of FIG. 2A in which an upper surface 210a of the insulating body 210 opposite to the mounting surface 201b is shown in accordance with two embodiments. In particular, in the embodiment illustrated in FIG. 2B, the upper surface 210a is devoid of exposed leads. In the embodiment illustrated in FIG. 2C an upper common source pad Lscu electrically connected to both the source terminals S1 and S2 of both transistors P1 and P2 and having a generally rectangular shape (which acts as a heat sink), extends on about one third of the upper surface 210a of the insulating body 210.

The package 205 is of the SMT type—that is, adapted to be mounted on a printed circuit board (not shown in the figure) with its mounting surface 210b resting on the same, and leads Ld1, Ld2, Lsc1, Lsc2, Lsc3, Lsc4, Ls1, Ls2, and Lcg1 Lcg2 welded on corresponding conductive tracks.

Figure 3A:
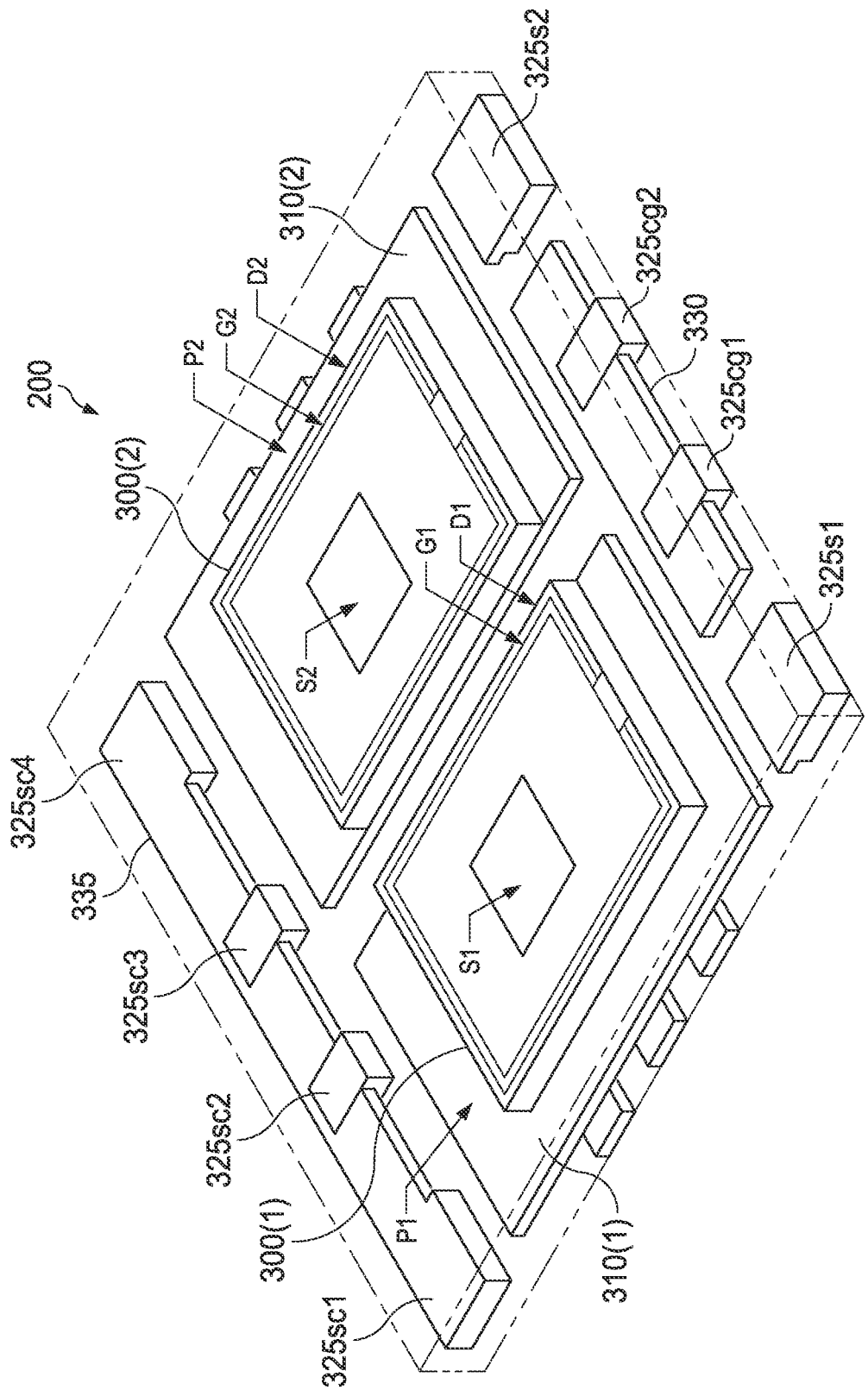
FIGS. 3A and 3B show a perspective view from above and from below, respectively, with parts partially removed of the electronic device of FIGS. 2A-2C in accordance with an embodiment.
Figure 3B:
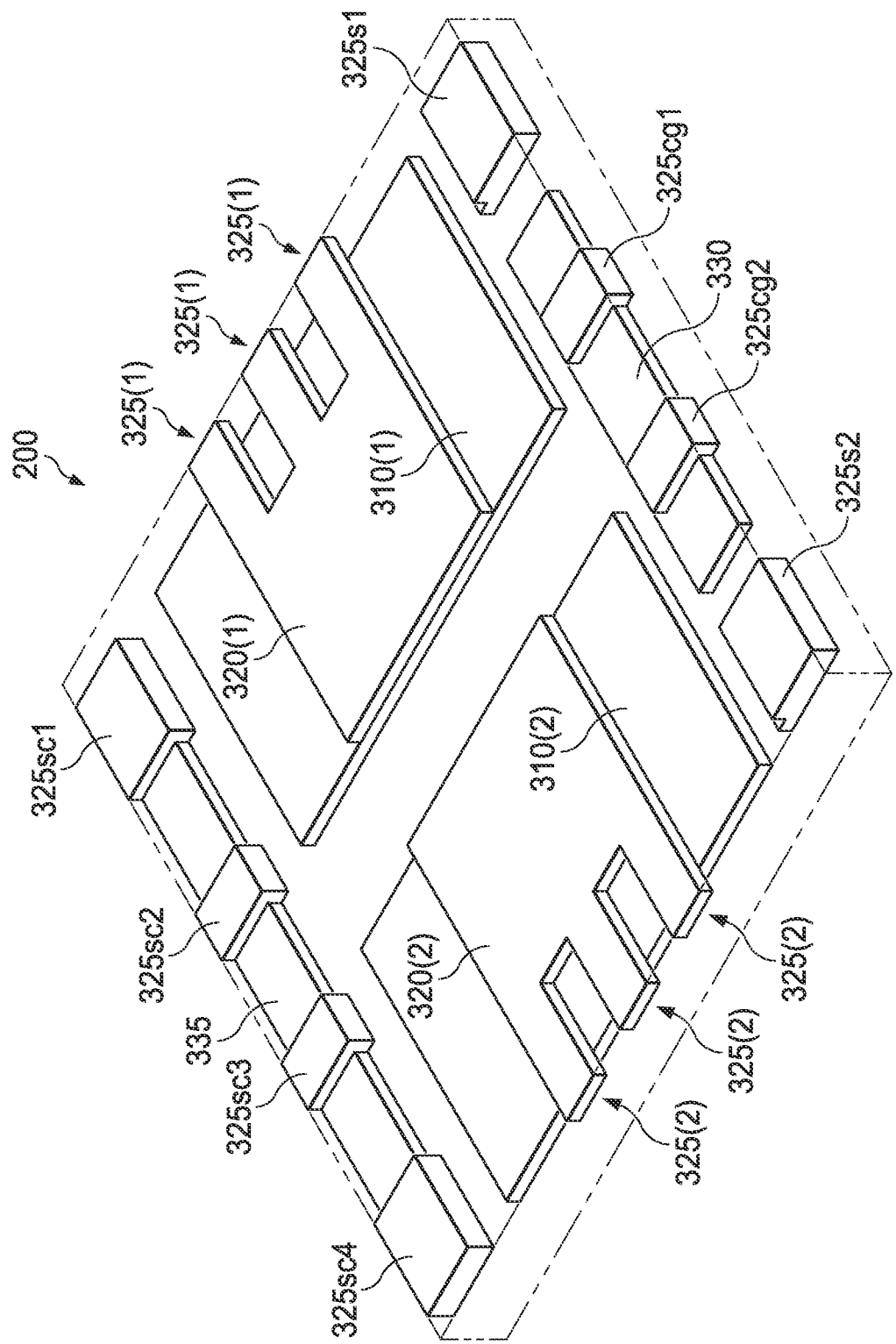

Turning to FIGS. 3A and 3B, they show a perspective view from above and from below, respectively, with parts partially removed, of the electronic device 200 in accordance with an embodiment.

The transistor P1 and the transistor P2 are integrated in a semiconductor material chip 300(1) and 300(2), respectively, on which the terminals S1, S2, G1, G2 and D1, D2 of the corresponding transistor—made in electrically conductive material (e.g., metallic material)—are arranged. In particular, the drain terminal D1, D1 (not visible in the figures) extends over an entire rear surface of the chip 300(1), 300(2). A front surface of the chip 300(1), 300(2) (opposite to its rear surface) is instead covered by an insulating layer 305(1), 305(2). A tap that defines the source terminal S1, S2, and a tap that defines the gate terminal G1, G2 of the corresponding transistor are exposed from the insulating layer 305(1), 305(2) on the front surface of the chip 300(1), 300(2). The source terminal S1, S2 has a generally rectangular shape, and is arranged approximately at the center of the front surface of the chip 300(1), 300(2). The gate terminal G1, G2 comprises instead a frame disposed in the vicinity of an edge of the front surface 300(1), 300(2) of the chip 300(1), 300(2) (so as to surround the source terminal S1,S2) and a connection pad that widens outwards from that frame at the center of a segment thereof facing to the leads Ls1, Ls2, Lcg1, Lcg2.

The electronic device 200 further comprises a first lower heat sink 310(1) thermally and electrically conductive (e.g., in metallic material), on which the chip 300(1) is fixed, and a second lower heat sink 310(2) thermally and electrically conductive (e.g., in metallic material), on which the chip 300(2) is fixed. The heat sink 310(1) comprises a plate 315(1) having a generically rectangular shape. As shown in FIG. 3B, the heat sink 310(1) also comprises a strip 320(1) that protrudes downward from the plate 315(1) (from the side opposite to the chip 300(1)). The strip 320(1) extends over a central portion of the plate 315(1), from a first end of an edge of the plate 315(1) located substantially at the center of the electronic device 200 to a second end located near the edge of the electronic device 200 where the first side surface 210c is located. The second end of the strip 320(1) presents (three) projecting elements 325(1) which protrude at least partly over the plate 315(1). The heat sink 310(1) is fully enclosed in the insulating body 210, with the exception of a free surface of the strip 320(1) and of (back and side) free surfaces of the protruding elements 325(1), which are exposed to define, respectively, the pad Ld1p and the extension elements Ld11, Ld12, Ld13 of the first drain lead Ld1 (so as to provide a high surface to transfer outside the heat produced by the chips, but at the same time ensure a good adhesion of the insulating body 210 to the heat sink 310(1)). Similarly, the heat sink 310(2) also comprises a strip 320(2) that protrudes downward from the plate 315(2) (from the side opposite to the chip 300 (2)). The strip 320(2) extends over a central portion of the plate 315(2), from a first end of an edge of the plate 315(2) substantially located at the center of the electronic device 200 to a second end located near the edge of the electronic device 200 where the second side surface 210d is located. The second end of the strip 320(2) presents (three) projecting elements 325(2) which protrude at least partly over the plate 315(2). The heat sink 310(2) is fully enclosed in the insulating body 210, with the exception of a free surface of the strip 320(2) and of free (back and side) surfaces of the protruding elements 325(2), which are exposed to define, respectively, the pad Ld2p and the extension elements Ld21, Ld22, Ld23 of the second drain lead Ld2 (so as to provide a high surface to transfer outside the heat produced by the chips, but at the same time ensure a good adhesion of the insulating body 210 to the heat sink 310(2)).

The chip 300 (1) is mounted on the plate 315(1) of the heat sink 310(1) at its rear surface, so that the drain terminal D1 is fixed to it (for example, welded onto the plate 315(1)). Similarly, the chip 300 (2) is mounted on the plate 315(2) of the heat sink 310(2) at its rear surface, so that the drain terminal D2 is fixed to it (for example, welded on the plate 315(2)).

For each of the leads Ls1, Ls2, Lcg1, Lcg2, Lsc1, Lsc2, Lsc3 and Lsc4, the package 205 also comprises a socket 325s1, 325s2, 325cg1, 325cg2, 325sc1, 325sc2, 325sc3 and 325sc4, respectively, made of electrically conductive material (for example, a metallic material). Each socket 325s1, 325s2, 325cg1, 325cg2, 325sc1, 325sc2, 325sc3 and 325sc4 is formed by a base having a generally parallelepiped shape, whose (back and side) outer surfaces are exposed from the insulating body 210 to define the corresponding lead Ls1, Ls2, Lcg1, Lcg2, Lsc1, Lsc2, Lsc3 and Lsc4. The socket 325s1 and the socket 325s2 each comprise a platform made in an electrically conductive material (e.g., a metallic material) which extends towards the inside of the insulating body 210 so as to define a corresponding contact pad. The socket 325cg1 and the socket 325cg2 are connected to a common platform 330 made of an electrically conductive material (e.g., a metallic material) which extends along a central portion of the edge of the insulating body 210 where the third lateral surface 210e is located. The sockets 325sc1, 325sc2, 325sc3 and 325sc4 are connected to a common platform 335 made of an electrically conductive material (e.g., a metallic material) that extends along the edge of the insulating body 210 where the fourth side surface 210F is located.

Figure 3C:
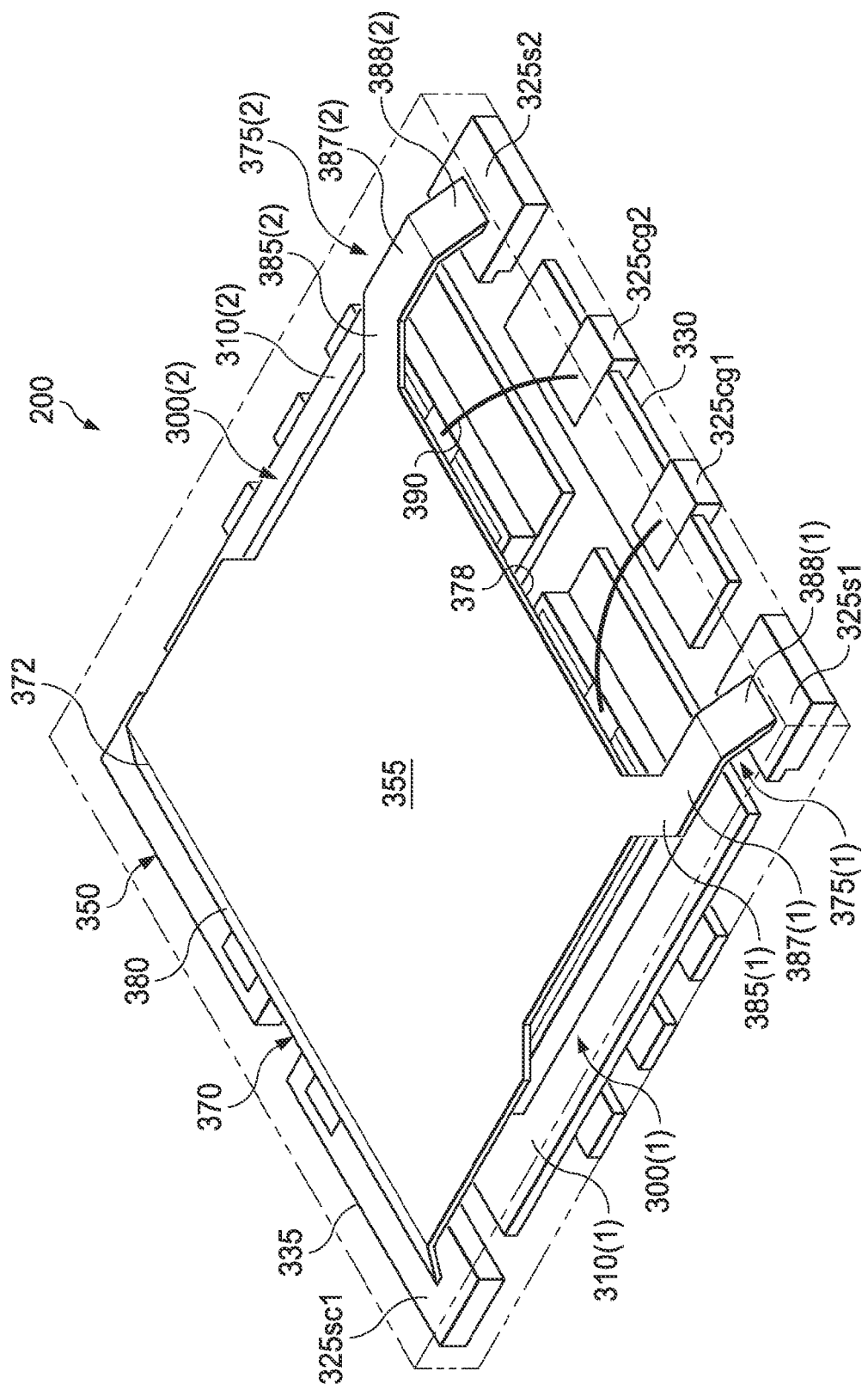
FIG. 3C shows a perspective view from above with partially removed parts of the electronic device of FIGS. 2A-2C in which a top heat sink is visible in accordance with one embodiment.

FIG. 3C shows a further perspective view from above of the electronic device 200 with partially removed parts in which, unlike FIG. 3A, a top heat sink 350 is visible in accordance with an embodiment. The top heat sink 350, made of electrically and thermally conductive (e.g., metallic material), allows the source terminals S1 and S2 of the chips 300(1), 300(2) to be in thermal and electrical contact with the source leads Ls1, Ls2, and with the common source leads Lsc1, Lsc2, Lsc3 and Lsc4.

Figure 3D:
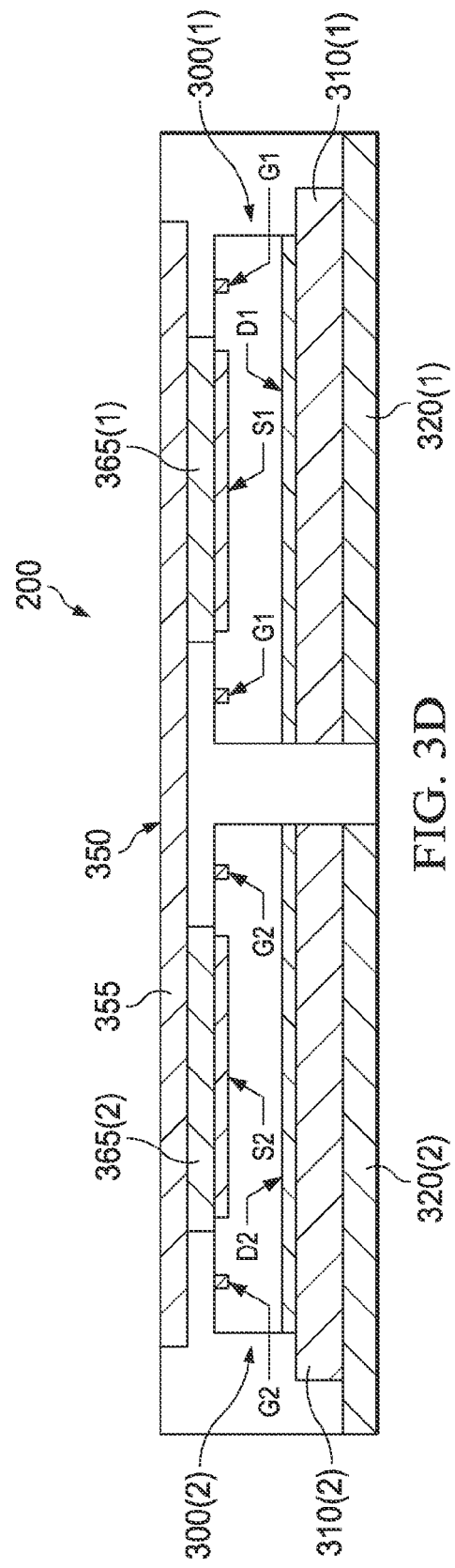
FIG. 3D shows a sectional side view of the electronic device of FIG. 3C.

The top heat sink 350 includes a main plate 355 made of an electrically and thermally conductive material (for example, a metallic material) having a substantially rectangular shape which extends in plan view, in the central portion of the electronic device 200, substantially above both the chip 300 (1) and the chip 300(2). As visible in FIG. 3D, which shows a sectional side view of the electronic device 200 of FIG. 3C, the top heat sink 350 includes support elements 365(1), 365 (2) made of an electrically and thermally conductive material (for example, a metallic material) through which the top heat sink 350 is in thermal and electrical contact with the source terminals S1, S2 of the chips 300(1), 300(2). In particular, the support elements 365(1), 365(2) have a lower surface in contact with the source terminals S1, S2 of the chips 300(1), 300(2), and an upper surface in contact with a lower surface of the main plate 355 of the upper heat sink 350. Referring again to FIG. 3C, the top heat sink 350 also comprises a contact portion 370 which extends substantially along an entire edge 372 of the main plate 355 located near the portion of the electronic device 200 where the sockets 325sc1, 325sc2, 325sc3 and 325sc4 are located; the contact portion 370 extends from the edge of the main plate 355 up to contact the platform 335 connected to the sockets 325sc1, 325sc2, 325sc3 and 325sc4. The upper heat sink 350 further comprises a first contact element 375(1) which extends from one end of an edge 378 of the main plate 355 opposite to the edge 372, up to contact the platform of the socket 325s1. The upper heat sink 350 further comprises a second contact element 375(2) that extends from the opposite end of the edge 378 from which the first contact element 372(1) extends, up to contact the platform socket 325s2.

Since the main plate 335 is located in the electronic device 200 to a level higher than that in which the platform 335 and the platforms of the sockets 325s1 and 325s2 are located, both the contact portion 370 and the contact elements 375(1) and 375(2) comprise portions that are folded toward the mounting surface 210b of the insulating body 210. Specifically, the contact portion 370 includes a portion 380 at least partially directed towards the mounting surface 210b and at least partially in contact with the platform 335. Furthermore, in succession from the edge 378, the contact element 375 (1) includes a first portion 385(1) at least partially directed towards the mounting surface 210b, a second portion 387(1) that extends substantially parallel to the mounting surface 210b overstepping in plan view the plate 315(1) of the first heat sink 310(1) up to reach the platform of the socket 325s1, and a third portion 388(1) at least partially directed towards the mounting surface 210b and at least partially in contact with the platform of the socket 325s1. In the same way, in succession from the edge 378, the contact element 375(2) comprises a first portion 385(2) at least partially directed towards the mounting surface 210b, a second portion 387 (2) that extends substantially parallel to the mounting surface 210b overstepping in plan view the plate 315(2) of the second heat sink 310(2) up to reach the platform of the socket 325s2, and a third portion 388(2) at least partially directed towards the mounting surface 210b and at least partially in contact with the platform of the socket 325s2.

Connecting wires 390 fixed between the connection pad of each gate terminal G1, G2 of the chips 300(1), 300(2) and the platform 330 allow the electrical connection between the common gate leads Lcg1 and Lcg2 and the gate terminals G1, G2.

In the embodiment illustrated in FIG. 2B, the upper heat sink 350 is entirely enclosed in the insulating body 210, and is not accessible from the outside. In the embodiment illustrated in FIG. 2C, a portion of the main plate 355 of the top heat sink 350 is exposed from the upper surface 210a of the insulating body, defining the upper common source pad Lscu.

The structure described above for the electronic device 200 allows to house both the transistor P1 and the transistor P2 in a single package 205, so as to obtain a very compact structure. This sensibly reduces the size of the switch circuit 165 formed by these transistors, with a corresponding reduction in size of the entire protection system for the battery pack. Moreover, in this way also the manufacturing of the protection system for the battery pack it is simplified, with a consequent reduction of its production cost. The top heat sink 350 has a large single surface which also improves the heat dissipation efficiency of the electronic device 200, and thus its performance.

Figure 4A:
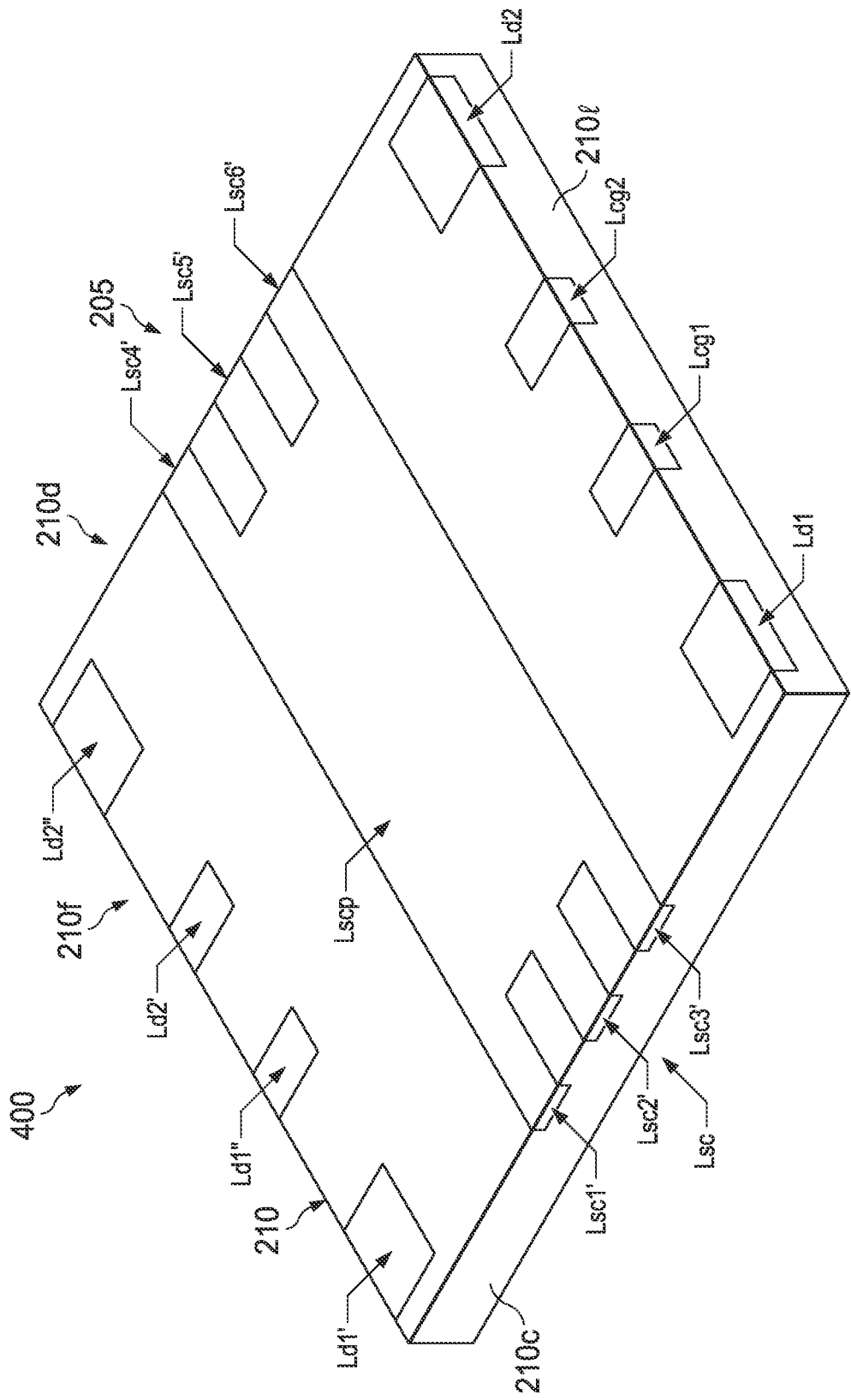
FIG. 4A shows a perspective view of an overturned electronic device in accordance with a further embodiment.

A schematic overall view of an electronic device in accordance with another embodiment that can be used in the protection circuit 110 as the switch circuit 165 is shown in FIG. 4A with the reference 400. In particular, FIG. 4A shows a perspective view of the electronic device 400 upside down.

Unlike the embodiment corresponding to the electronic device 200 illustrated in FIGS. 2A-2C and 3A-3D, the package 205 of the electronic device 400 includes a common source lead Lsc electrically connected to the source terminals S1 and S2 of the transistors P1 and P2 comprising a pad Lscp having a generically rectangular shape (which also acts as a heat sink) which extends over approximately one third of the mounting surface 210b of the insulating body 210. The common source lead Lsc further comprises first extension elements (three in the figure) Lsc1', Lsc2', Lsc3' formed by pads having a generally squared shape which extend from the pad Lscp half on the mounting surface 210b and half on the side surface 210c of the insulating body 210, and second extension elements (three in the figure) Lsc4', Lsc5', Lsc6' formed as well by pads having a generally squared shape which extend from the pad Lscp half on the mounting surface 210b and half on the side surface 210d of the insulating body 210. A first drain lead Ld1 electrically connected to the source terminal D1 of the transistor P1 and a second drain lead Ld2 electrically connected to the drain terminal D2 of the transistor P2 are distributed on opposite ends along the edge of the mounting surface 201b between the mounting surface 210b and the third lateral surface 210e of the insulating body 210. Each drain lead Ld1, Ld2 is formed by a pad having a generically squared shape which extends half on the mounting surface 210b and half on the third lateral surface 210F. Two common gate leads Lcg1 Lcg2 electrically connected to both the gate terminals G1 and G2 of both the transistors P1 and P2 are located along the edge of the mounting surface 201b between the mounting surface 210b and the third side surface 210e between the drain leads Ld1 and Ld2. Each common gate lead Lcg1, Lcg2 is formed by a pad having a generically squared shape which extends half on the mounting surface 210b and half on the third lateral surface 210f. Two additional drain leads Ld1', Ld1" electrically connected to the drain terminal D1 of the transistor P1 are distributed along a first half of the edge of the mounting surface 201b between the mounting surface 210b and the fourth side surface 210f of the insulating body 210; two further drain additional leads Ld2', Ld2" electrically connected to the drain terminal D2 of the transistor P2 are distributed along the other half of the edge of the mounting surface 201b between the mounting surface 210b and the fourth side surface 210f of the insulating body 210. Each drain additional lead Ld1', Ld1 ", Ld2', Ld2" is formed by a pad having a generically squared shape which extends half on the mounting surface 210b and half on the fourth side surface 210f.

Figure 4B:
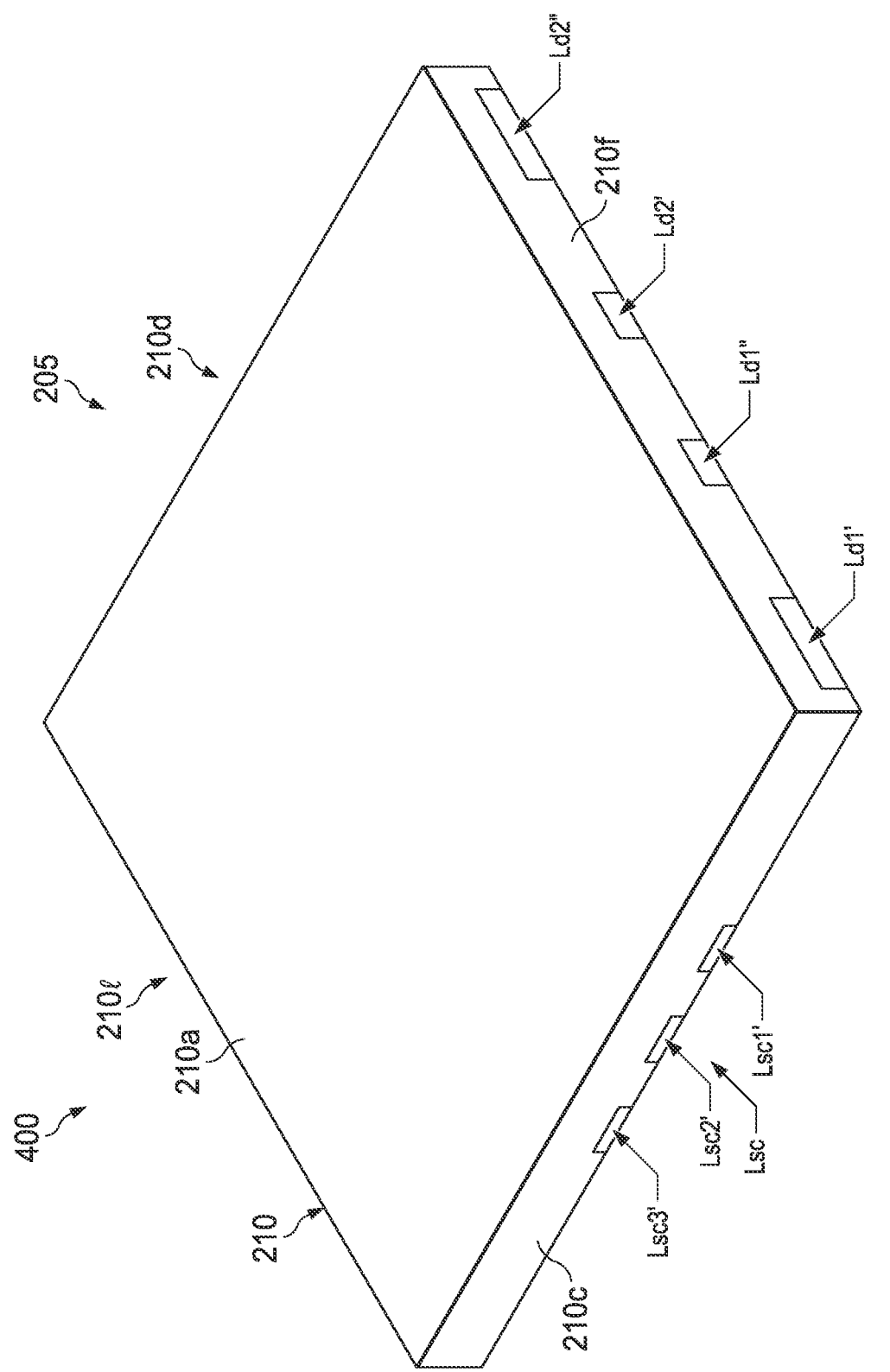
FIG. 4B shows a perspective view from above of the electronic device of FIG. 4A in accordance with an embodiment.
Figure 4C:
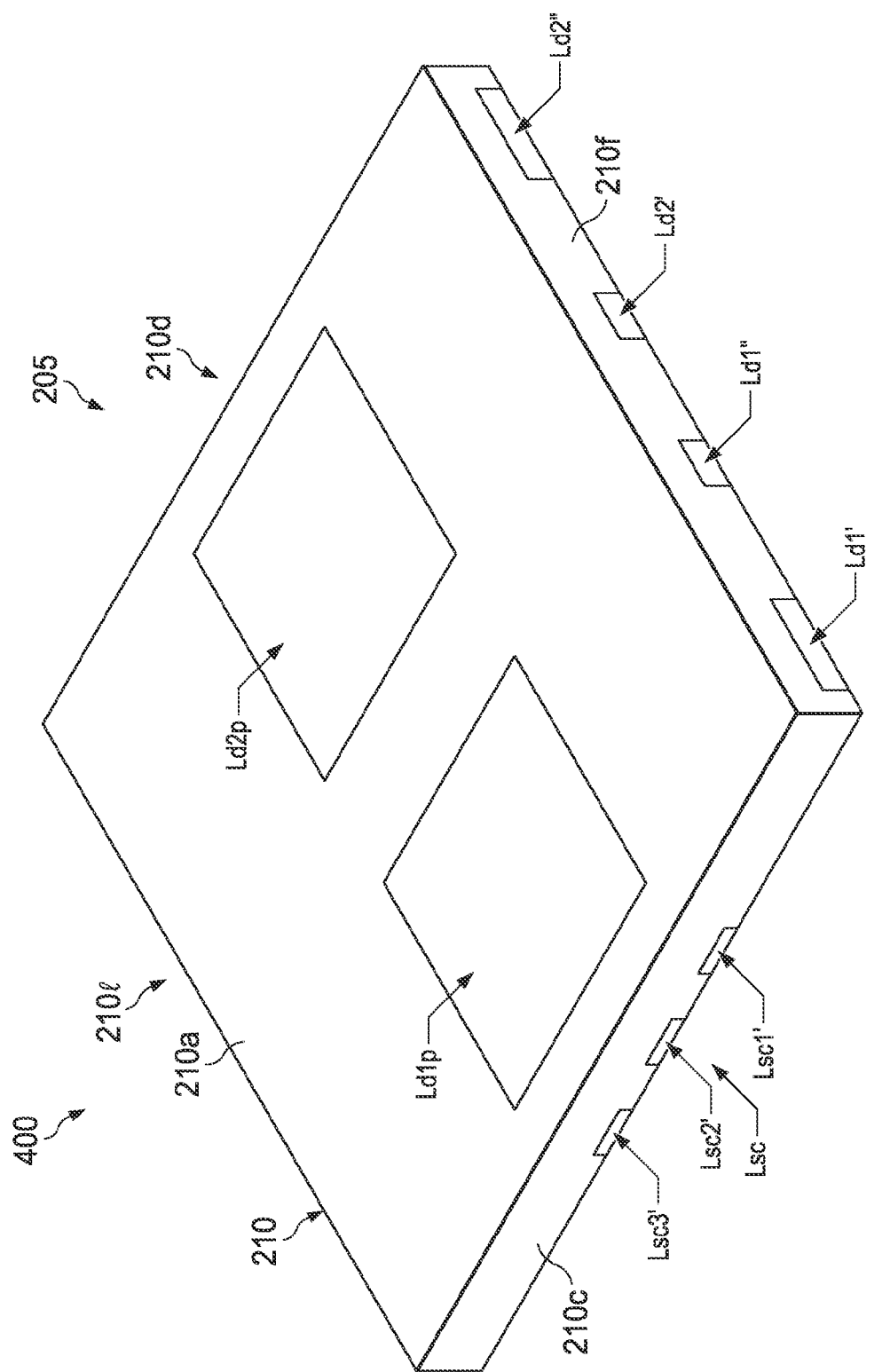
FIG. 4C shows a perspective view from above of the electronic device of FIG. 4A in accordance with a further embodiment.

FIGS. 4B and 4C show a perspective view of the electronic device 400 of FIG. 4A in which the upper surface 210a of the insulating body 210 is shown in accordance with two embodiments. In particular, in the embodiment illustrated in FIG. 4B, the upper surface 210A is devoid of exposed leads. In the embodiment illustrated in FIG. 4C a first drain pad Ld1p having a generically rectangular shape and electrically connected to the drain terminal D1 of the transistor P1 (which acts as a heat sink) extends over approximately one third of one half of the upper surface 210a of the insulating body 210, while a second drain pad Ld2p having a generically rectangular shape and electrically connected to the drain terminal D2 of the transistor P2 (which acts as a heat sink) extends over approximately one third of the other half of the upper surface 210a of the insulating body 210.

Figure 5A:
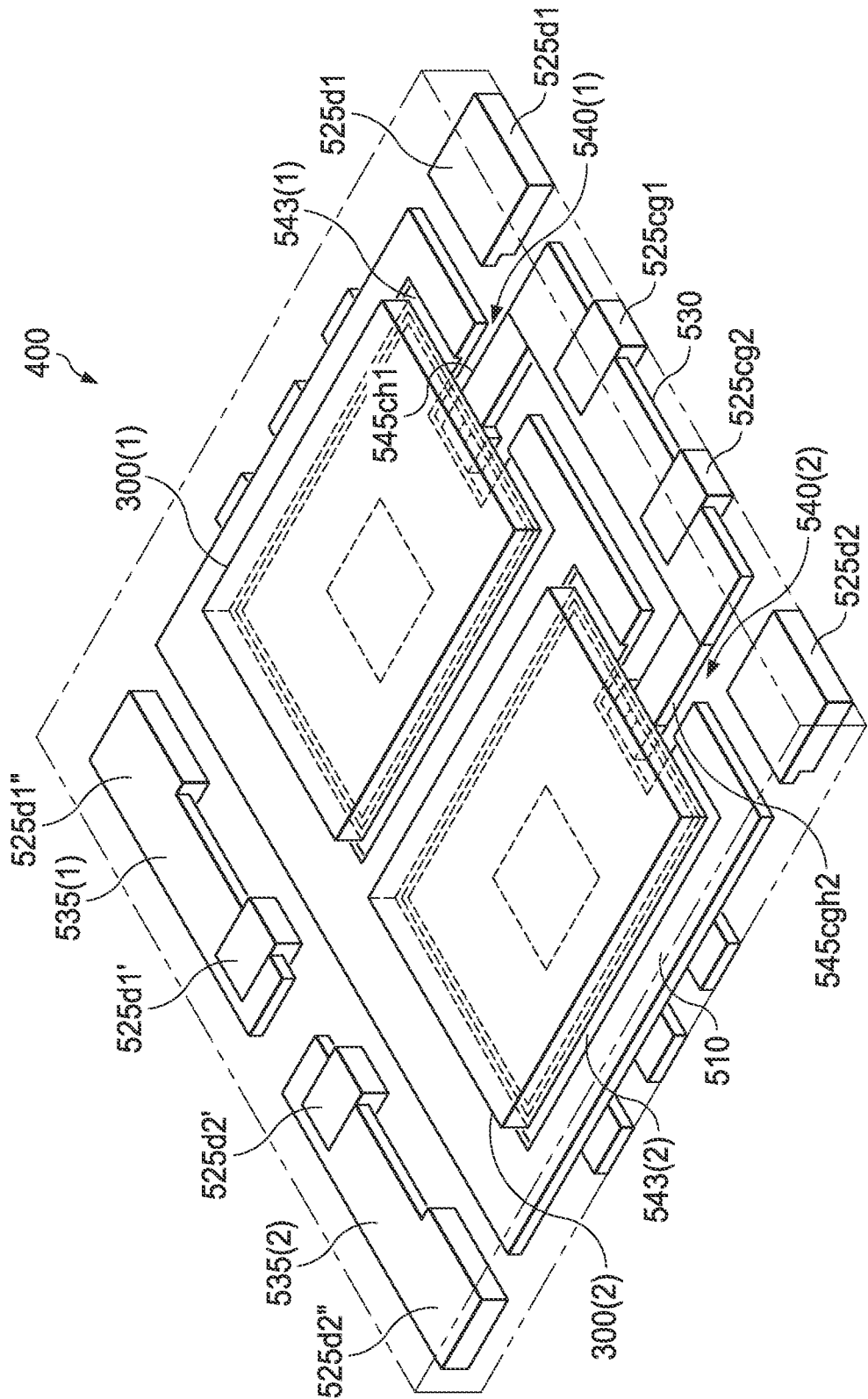
FIGS. 5A and 5B show a perspective view from above and from below, respectively, with parts partially removed, of the electronic device of FIGS. 4A-4C in accordance with an embodiment.
Figure 5B:
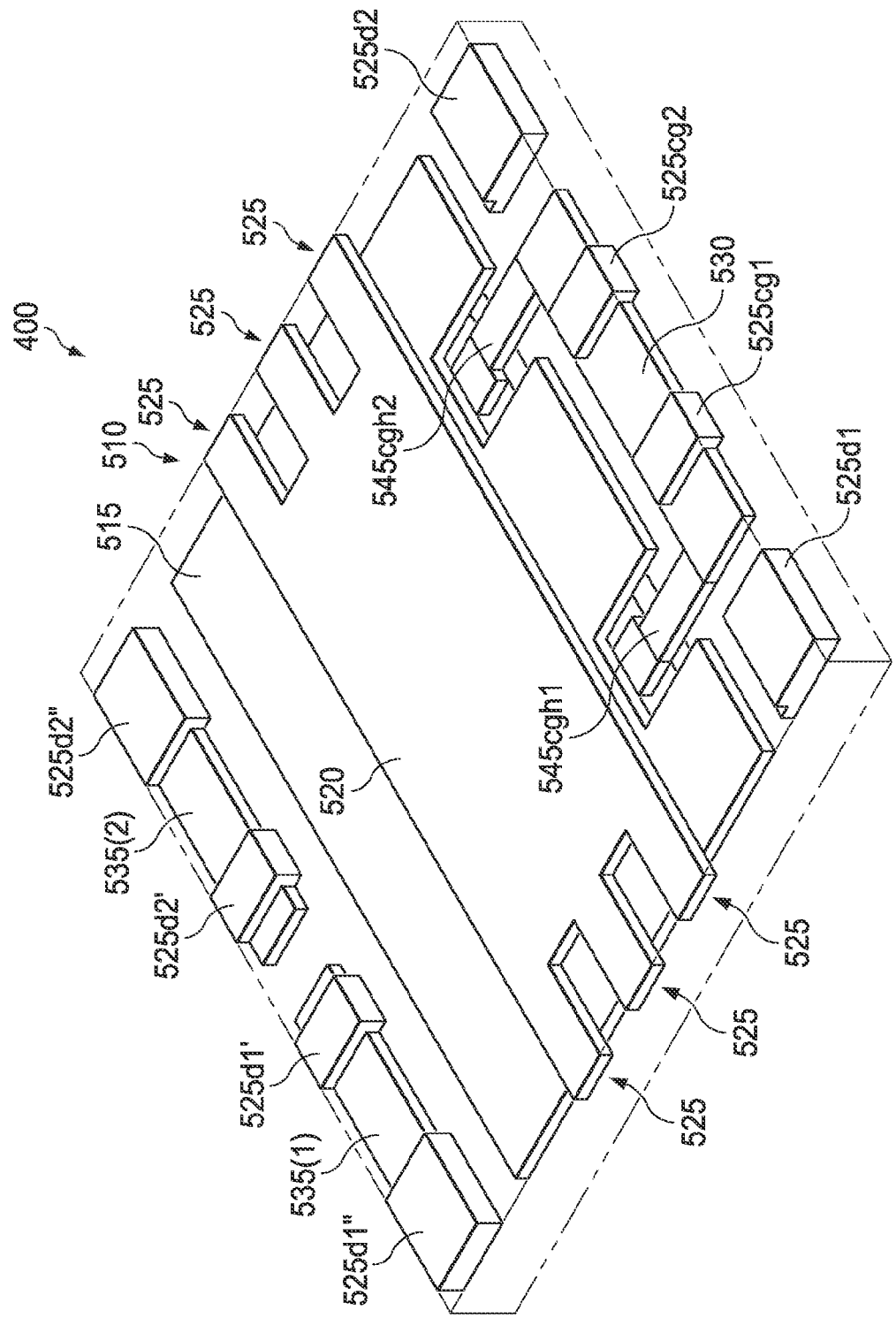

Turning to FIGS. 5A and 5B, they show a perspective view from above and from below, respectively, with partially removed parts and with transparent parts of the electronic device 400 in accordance with an embodiment.

The electronic device 400 comprises a bottom heat sink 510 thermally and electrically conductive (e.g., made of metallic material), on which are fixed both chips 300(1), 300(2) on which are integrated the transistors P1 and P2. Chips 300(1) and 300(2) are mounted upside down on the bottom heat sink 510 at their front surfaces, so that their source terminals S1, S2 are fixed to it. The bottom heat sink 510 includes a plate 515 having a generically rectangular shape. As shown in FIG. 5B, the bottom heat sink 510 also includes a strip 520 which protrudes from the chip 515 downward (from the side opposite to chips 300(1), 300(2)). The strip 520 extends over a central portion of the chip 515, from a first end located near the edge of the electronic device 200 where the first side surface 210c is located, to a second end located near the edge of the electronic device 200 where the second side surface 210d is located. These two ends of the strip 520 each have (three) protruding elements 525 which protrude at least partly over the plate 515. The heat sink 510 is fully enclosed in the insulating body 210, with the exception of a free surface of the strip 520 and of (back and side) free surfaces of the protruding elements 525, which are exposed to define, respectively, the pad Lscp and the extension elements Lsc1', Lsc2', Lsc3', Lsc4', Lsc5', Lsc6' of the common source lead Lsc.

For each of the leads Ld1, Ld2, Lcg1, Lcg2, Ld1', Ld1", Ld2', Ld2", the package 205 also comprises a socket 525d1, 525d2, 525cg1, 525cg2, 525d1', 525d1", 525d2' and 525d2", respectively, made of electrically conductive material (e.g., metallic material). Each socket 525d1, 525d2, 525cg1, 525cg2, 525d1', 525d1", 525d2' and 525d2" is formed by a base having a generically parallelepiped shape, whose (back and side) outer surfaces are exposed from the insulating body 210 to define the corresponding lead Ld1, Ld2, Lcg1, Lcg2, Ld1', Ld1 ", Ld2', Ld2". The socket 525d1 and the socket 525d2 each comprise a platform made on an electrically conductive material (e.g., metallic material) which extends towards the inside of the insulating body 210 so as to define a corresponding contact pad. The socket 525cg1 and the socket 525cg2 are connected to a common platform 530 made of electrically conductive material (e.g., metallic material) which extends along a central portion of the edge of the insulating body 210 where the third lateral surface 210e is located. The hooves 525d1' and 525d1', are connected to a common platform 535(1) made of electrically conductive material (e.g., metallic material) which extends along a portion (behind the chip 310(1)) of the edge of the insulating body 210 where the fourth lateral surface 210f is located. In an equivalent manner, the sockets 525d2' and 525d2", are connected to a common platform 535(2) made of an electrically conductive material (e.g., made of a metallic material) which extends along another portion (behind the chip 310(2)) of the edge of the insulating body 210 where is located the fourth side surface 210f.

In the embodiment shown in FIGS. 4A-4C and 5A-5B, the plate 515 has a first side recesses 540(1), which extends from a longitudinal edge of the plate 515 facing to the leads Ld1, Ld2, Lcg1, Lcg2 (at the height of the gate lead Lcg1) up to in proximity of the strip 520 (see FIG. 5B); a portion of the gate terminal G1 (comprising its pad and a small part of its frame) is arranged at the recess 540(1), so that such portion of the gate terminal G1 is isolated from the plate 515. Furthermore, a first groove 543(1) is formed above the plate 515 (facing the chip 300(1)); the groove 543(1) has a generally rectangular shape, interrupted by the recess 540(1), with an external size greater than the largest gate terminal G1 and the largest chip 300(1) that can be mounted on the plate 515 and an internal size smaller than the smallest gate terminal G1 that can be mounted on the plate 515. In this way, the groove 543(1) extends around a remaining portion of the gate terminal G1 (comprising the majority of its frame), so that even such a portion the gate terminal G1 is isolated from the chip 515. Consequently, the entire gate terminal G1 is isolated from the heat sink 510 (and therefore from the source terminals S1 and S2). The plate 515 also has a second side recess 540(2), which extends from a longitudinal edge of the chip 515 facing to the leads Ld1, Ld2, Lcg1, Lcg2 (at the height of the lead gate Lcg2) up to in proximity of the strip 520 (see FIG. 5B), a portion of the gate terminal G2 (comprising its pad connection and a small part of its frame) is arranged at the recess 540(2), for which such portion of the gate terminal G2 is isolated from the chip 515. Furthermore, a second groove 543(2) is formed above the chip 515 (facing the chip 300(2)); the groove 543(2) has a generally rectangular shape, interrupted by recess 540(2), with an external size larger than the largest gate terminal G2 and larger than the largest chip 300(2) that can be mounted on the plate 515 and an internal size smaller than the smallest gate terminal G1 that can be mounted on the chip 515. In this way, the groove 543(2) extends around a remaining portion of the gate terminal G2 (comprising the majority of its frame), so that even such a portion of the gate terminal G2 is isolated from the chip 515. Consequently, the entire gate terminal G2 is isolated from the heat sink 510 (and therefore from the source terminals S1 and S2).

The above described structure of the heat sink 510 (i.e., extended with recesses) allows to keep the heat sink 510 as wide as possible (further improving the heat dissipation efficiency), while ensuring the correct electrical operation of the electronic device 400.

A first shelf 545gh1 made of an electrically conductive material (e.g., a metallic material) extends from one end of the platform 530 (keeping the same thickness) that connects the sockets 525cg1 and 525cg2 within the recess 540(1); the shelf 545gh1 has an enlarged free end (which defines a corresponding contact pad, also of reduced thickness), which surrounds the contact pad of the gate terminal G1 (see FIG. 5B). The connection pad of the shelf 545gh1 is directly fixed on the contact pad of the gate terminal G1 (so as to electrically connect the gate terminal G1 to the common gate leads Lcg1, Lcg2). In an equivalent manner, a second shelf 545gh2 made of an electrically conductive material (e.g., a metallic material) extends from the other end of the platform 530 (keeping the same thickness) within the recess 540(1); the shelf 545gh2 has an enlarged free end (which defines a corresponding contact pad, also of reduced thickness), which surrounds the connection pad of the gate terminal G2 (see FIG. 5B). The connection pad of the shelf 545gh2 is directly fixed on the connection of the gate terminal G2 (so as to electrically connect the gate terminal G2 to the common gate leads Lcg1, Lcg2). This allows to access in a very simple and effective way the gate terminals G1 and G2 even with the extended structure with recesses of the heat sink 510.

Figure 5C:
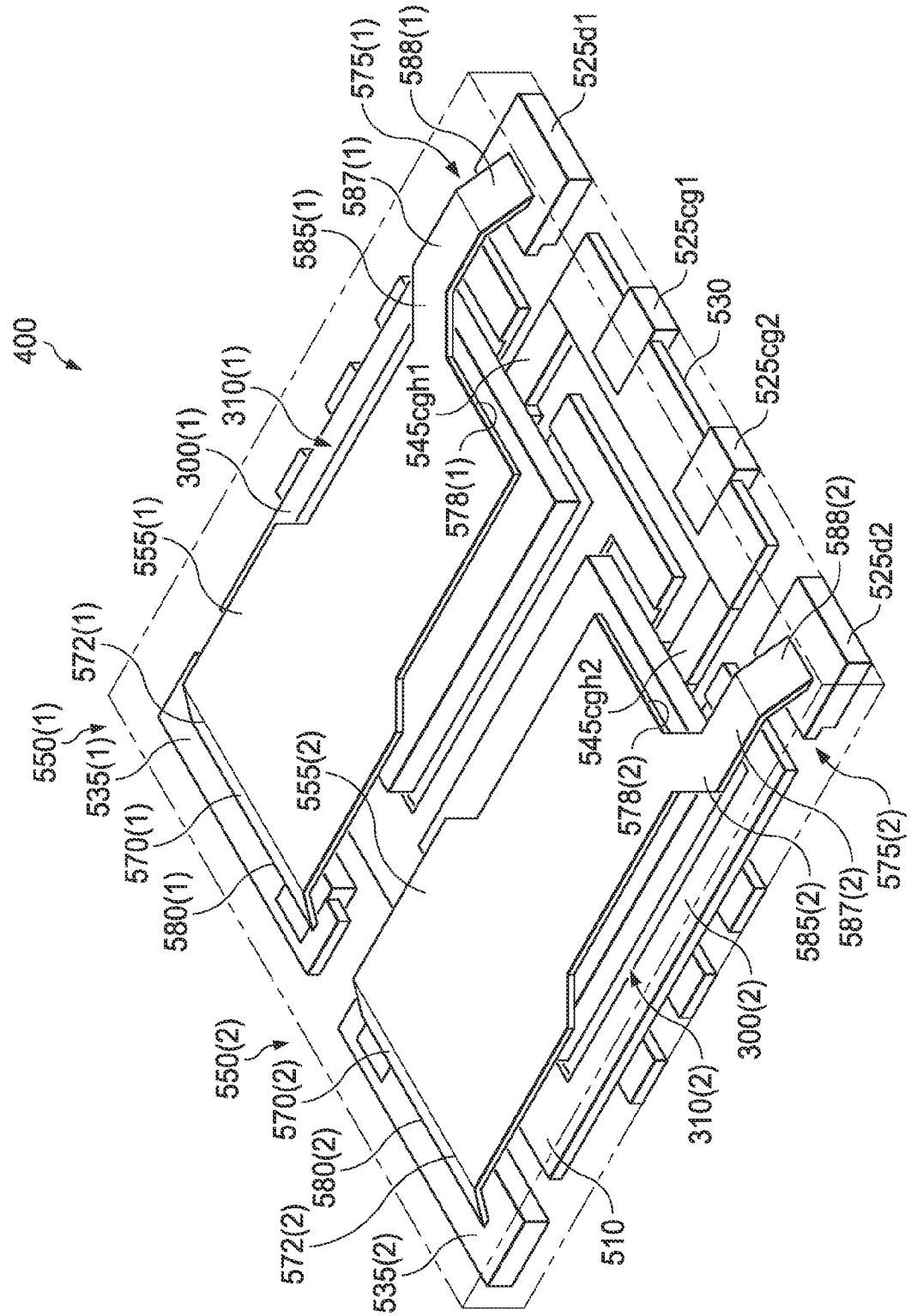
FIG. 5C shows a perspective view from above with parts partially removed of the electronic device of FIGS. 4A-4C in which two top heat sinks are visible in accordance with an embodiment.
Figure 5D:
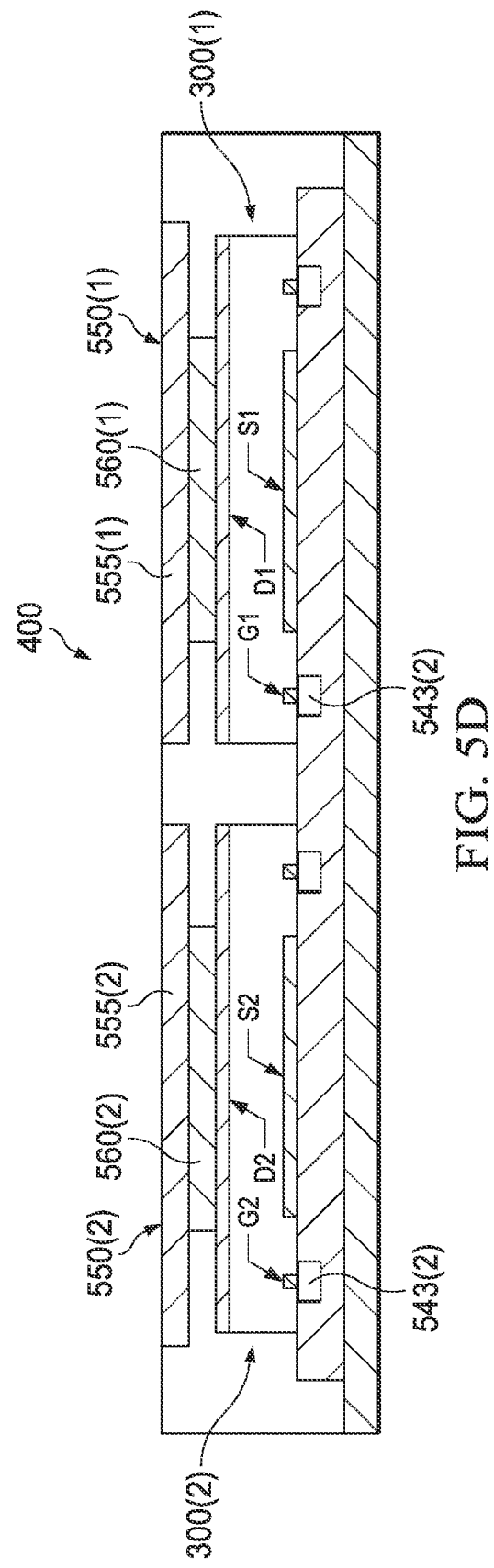
FIG. 5D shows a sectional side view of the electronic device of FIG. 5C.

FIG. 5C shows a further perspective view from above of the electronic device 400 with partially removed parts in which, unlike FIG. 5A, are visible a first top heat sink 550(1) and a second top heat sink 550(2) in accordance with one embodiment. The top heat sink 550(1), made of electrically and thermally conductive material (e.g., made of metallic material), allows the drain terminal D1 of the chip 300(1) to be in thermal and electric contact with the drain lead Ld1 and with the additional drain leads Ld1', Ld1". The top heat sink 550(2), made of electrically and thermally conductive material (e.g., made of metallic material), allows the drain terminal D2 of the chip 300(2) to be in thermal and electric contact with the drain lead Ld2 and with the additional drain leads Ld2', Ld2".

In a similar manner to the top heat sink 350 of the electronic device 200 illustrated in FIG. 3C, the top heat sink 550(1) comprises a main plate 555(1) having a substantially rectangular shape that extends in plan view substantially above the chip 300(1). As shown in FIG. 4D, which shows a sectional side view of the electronic device 200 of FIG. 4C, the top heat sink 550(1) comprises a support element 560(1) made of an electrically and thermally conductive material (for example, made of metallic material) through which the top heat sink 550(1) is in electrical and thermal contact with the drain terminal D1 of the chip 300(1). In particular, the support element 560(1) has a lower surface in contact with the drain terminal D1 of the chip 300(1), and an upper surface in contact with a lower surface of the main chip 555(1) of the top heat sink 550(1). The top heat sink 550(2) comprises a main plate 555(2) having a substantially rectangular shape that extends in plan view substantially above the chip 300(2). As shown in FIG. 4D, the top heat sink 550(2) comprises a support element 560(2) made of an electrically and thermally conductive material (for example, in a metallic material) through which the top heat sink 550(2) is in electrical and thermal contact with the drain terminal D2 of the chip 300(2). In particular, the support element 560(2) has a lower surface in contact with the drain terminal D2 of the chip 300(2), and an upper surface in contact with a lower surface of the main plate 555(2) of the top heat sink 550(2).

Referring again to FIG. 5C, the top heat sink 550(1) further comprises a contact portion 570(1) that extends substantially along a whole edge 572(1) of the main plate 555(1) located close to the portion of the electronic device 400 where the sockets 525d1' and 525d1"; the contact portion 570(1) extends from the edge of the main chip 555(1) up to contact the platform 535(1) connected to the sockets 525d1' and 525d1". The top heat sink 550(1) further comprises a contact element 575(1) which extends from one end of an edge 578(1) of the main chip 555(1) opposite to the edge 572(1), up to contact the platform of the socket 525d1. Both the contact portion 570(1) and the contact element 575(1) comprise portions folded toward the mounting surface 210b of the insulating body 210. Specifically, in succession from the edge 572(1), the contact portion 570(1) includes a portion 580(1) at least partially directed towards the mounting surface 210b and at least partially in contact with the platform 535(1). Furthermore, in succession from the edge 578(1), the contact element 575(1) comprises a first portion 585(1) at least partially directed towards the mounting surface 210b, a second portion 587(1) that extends substantially parallel to the mounting surface 210b overstepping in plan view the plate 515 of the heat sink 510 up to reach the platform of the socket 525d1, and a third portion 588(1) at least partially directed towards the mounting surface 210b and at least partially in contact with the platform of the socket 525d1. The top heat sink 550(2) comprises a contact portion 570(2) which extends substantially along a whole edge 572(2) of the main chip 555(2) located close to the portion of the electronic device 400 where the hooves 525*d*2' and 525*d*2" are located; the contact portion 570(2) extends from the edge of the main plate 555(2) up to contact the platform 535(2) connected to the sockets 525*d*2' and 525*d*2". The top heat sink 550(2) further comprises a contact element 575(2) which extends from one end of an edge 578(2) of the main chip 555(2) opposite to the edge 572(2), up to contact the platform of the socket 525*d*2. Both the contact portion 570(2) and the contact element 575(2) include portions folded towards the mounting surface 210*b* of the insulating body 210. Specifically, in succession from the edge 572(2), the contact portion 570(2) includes a portion 580(2) at least partially directed towards the mounting surface 210*b* and at least partially in contact with the platform 535(2). Furthermore, in succession from the edge 578(2), the contact element 575(2) includes a first portion 585(2) at least partially directed towards the mounting surface 210*b*, a second portion 587(2) which extends substantially parallel to the mounting surface 210*b* overstepping in plan view the chip 515 of the heat sink 510 to reach the platform of the socket 525*d*2, and a third portion 588(2) at least partially directed towards the mounting surface 210*b* and at least partially in contact with the platform of the socket 525*d*2.

In the embodiment illustrated in FIG. 4B, the top heat sinks 550(1) and 550(2) are entirely enclosed in the insulating body 210, and are not accessible from the outside. In the embodiment illustrated in FIG. 4C, a portion of the main plate 555(1) of the top heat sink 550(1) and a portion of the main plate 555(2) of the top heat sink 550(2) are exposed from the upper surface 210*a* of the insulating body, defining the drain pads Ld1p and Ld2p.

Even in this case, the structure described for the electronic device 400 allows to house both the transistor P1 and the transistor P2 in a single package 205, so as to obtain a very compact structure. This sensibly reduces the size of the switch circuit 165 formed by these transistors, with a corresponding reduction in size of the entire protection system for the battery pack. Moreover, in this way it is also simplified the manufacturing of the protection system for the battery pack, with a consequent reduction of its production cost. The top heat sinks 550(1) and 550(2) have large surfaces which also improve the efficiency of heat dissipation of the electronic device 400, and thus its performance. Furthermore, in this particular embodiment it is not necessary to use connecting wires to connect any terminal to the leads.

In accordance with a further embodiment (not shown), the sockets 525*cg*1 525*cg*2 are not connected to each other by means of the common platform 530, the sockets 525*d*1' and 525*d*1" are not connected to each other by means of the platform 535(1), and the sockets 525*d*2' and 525*d*2" are not connected to each other by means of the platform 535(2). In this case, the electrical connection between the gate terminal G1 of the transistor P1 and the gate terminal G2 of the transistor P2 is obtained externally to the electronic device 400, such as through appropriate electrical connections (tracks) on the board on which the insulating body 210 is welded, which connect the corresponding leads Ld1, Ld2, Ld1', Ld1 ", Ld2', Ld2".

Naturally, in order to satisfy contingent and specific requirements, a person skilled in the art may introduce to the solution described above many logical and/or physical modifications and variations. More specifically, although this solution has been described with a certain level of detail with reference to one or more embodiments thereof, it is clear that various omissions, substitutions and changes in the form and details as well as other embodiments are possible. In particular, various embodiments of the invention may be practiced without the specific details set forth in the preceding description to provide a more complete understanding of them, on the contrary, well-known features may be omitted or simplified in order not to obscure the description with unnecessary details. Moreover, it is expressly intended that specific elements and/or method steps described in relation to each embodiment of the exposed solution may be incorporated in any other embodiment as a normal design choice.

Moreover, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, similar considerations apply if the electronic device has a different structure or includes equivalent components, or has other operating characteristics. In any case, any component can be separated into several elements, or two or more components may be combined into a single element; in addition, each component may be replicated to support the execution of the corresponding operations in parallel. It should also be noted that (unless otherwise specified) any interaction between different components generally need not be continuous, and may be direct or indirect through one or more intermediaries.

In particular, the operating voltages and/or currents of the electronic device and its surface distances are merely indicative. The (common) package can be of any other type and realized in any other electrically insulating material (for example, a material of the ceramic type); similar considerations apply to the form and material of the main heat sink, and to the fixation of chips on the same (for example, by means of electrically conductive adhesive).

What is claimed is:

1. An electronic device, comprising:
a first transistor integrated in a first chip;
a second transistor integrated in a second chip;
wherein each first and second chip has a rear surface and a front surface opposite to each other, a first conduction terminal and a control terminal of the corresponding transistor on the front surface and a second conduction terminal of the corresponding transistor on the rear surface, the first transistor and the second transistor being connected with the first conduction terminal of the first transistor connected to the first conduction terminal of the second transistor;
a common package comprising an insulating body enclosing the first transistor and the second transistor and having a mounting surface; and
a heat sink enclosed in the insulating body in contact with the first conduction terminals of the first and second chips on the respective front surfaces, so that the first conduction terminals are electrically connected together by means of the heat sink,
a first further heat sink being in contact with the second conduction terminal of the first chip;
a second further heat sink being in contact with the second conduction terminal of the second chip;
wherein said heat sink comprises a conductive plate with a first side recess, at least a portion of the control terminal of the first chip being arranged at the first side recess so as to be insulated from the heat sink; and
wherein said conductive plate further comprises a second side recess, at least a portion of the control terminal of the second chip being arranged at the second side recess so as to be insulated from the heat sink.

2. The electronic device of claim 1, wherein said first chip and second chip are enclosed in the insulating body between the mounting surface of the insulating body and the conductive plate of the heat sink.

3. The electronic device of claim 2, wherein:
said electronic device comprises first conduction leads exposed from the insulating body at least on the mounting surface, said heat sink comprising contact elements which extend from the conductive plate up to contact the first conduction leads;
said first further heat sink comprises a portion exposed from the insulating body at least on the mounting surface, said exposed portion of the first further heat sink defining second conduction leads exposed from the insulating body;
said second further heat sink comprises a portion exposed from the insulating body at least on the mounting surface, said exposed portion of the second further heat sink defining third conduction leads exposed from the insulating body, and
said electronic device includes control leads exposed from the insulating body at least on the mounting surface, and conductive connection of the control terminals of the chips to the control leads.

4. The electronic device of claim 1, wherein said conductive plate of the heat sink comprises a portion exposed from the insulating body on a surface of the insulating body opposite to the mounting surface.

5. The electronic device of claim 1, wherein said first further heat sink comprises a first conductive plate and said second further heat sink comprises a second conductive plate, said first conductive plate being enclosed in the insulating body between the first chip and a surface of the insulating body opposite to the mounting surface, said second conductive plate being enclosed in the insulating body between the second chip and the surface of the insulating body opposite to the mounting surface.

6. The electronic device of claim 5, wherein:
said electronic device comprises third conduction leads exposed from the insulating body at least on the mounting surface, said first further heat sink comprising first contact elements that extend from the first conductive plate up to contact the third conduction leads;
said electronic device comprises fourth conduction leads exposed from the insulating body at least on the mounting surface, said second further heat sink comprising second contact elements that extend from the first conductive plate up to contact the fourth conduction leads; and
said heat sink comprises a portion exposed from the insulating body at least on the mounting surface, said exposed portion of the heat sink defining fifth conduction leads exposed from the insulating body.

7. The electronic device of claim 6, wherein said electronic device comprises sixth conduction leads exposed from the insulating body at least on the mounting surface, and a conductive connection of the control terminals of the first and of the second chips to the sixth control leads.

8. The device of claim 5, wherein:
said first conductive plate comprises a portion exposed from the insulating body on the surface of the insulating body opposite to the mounting surface; and
said second conductive plate comprises a portion exposed from the insulating body on the surface of the insulating body opposite to the mounting surface.

9. An electronic device, comprising:
a first transistor integrated in a first chip;
a second transistor integrated in a second chip;
wherein each first and second chip has a rear surface and a front surface opposite to each other, a first conduction terminal and a control terminal of the corresponding transistor on the front surface and a second conduction terminal of the corresponding transistor on the rear surface, the first transistor and the second transistor being connected with the first conduction terminal of the first transistor connected to the first conduction terminal of the second transistor;
a common package comprising an insulating body enclosing the first transistor and the second transistor and having a mounting surface; and
a heat sink enclosed in the insulating body in contact with the first conduction terminals of the first and second chips on the respective front surfaces, so that the first conduction terminals are electrically connected together by means of the heat sink,
wherein said heat sink comprises a conductive plate with a first side recess, at least a portion of the control terminal of the first chip being arranged at the first side recess so as to be insulated from the heat sink; and
wherein said conductive plate further comprises a second side recess, at least a portion of the control terminal of the second chip being arranged at the second side recess so as to be insulated from the heat sink.

10. The electronic device of claim 9, wherein said first chip and second chip are enclosed in the insulating body.

11. The electronic device of claim 9, further comprising a first further heat sink being in contact with the second conduction terminal of the first chip and a second further heat sink being in contact with the second conduction terminal of the second chip.

12. The electronic device of claim 11, wherein:
said electronic device comprises first conduction leads exposed from the insulating body at least on the mounting surface, said heat sink comprising contact elements which extend from the conductive plate up to contact the first conduction leads;
said first further heat sink comprises a portion exposed from the insulating body at least on the mounting surface, said exposed portion of the first further heat sink defining second conduction leads exposed from the insulating body;
said second further heat sink comprises a portion exposed from the insulating body at least on the mounting surface, said exposed portion of the second further heat sink defining third conduction leads exposed from the insulating body, and
said electronic device includes control leads exposed from the insulating body at least on the mounting surface, and conductive connection of the control terminals of the chips to the control leads.

13. The electronic device of claim 12, wherein:
said electronic device comprises third conduction leads exposed from the insulating body at least on the mounting surface, said first further heat sink comprising first contact elements that extend from the first conductive plate up to contact the third conduction leads;
said electronic device comprises fourth conduction leads exposed from the insulating body at least on the mounting surface, said second further heat sink comprising second contact elements that extend from the first conductive plate up to contact the fourth conduction leads; and said heat sink comprises a portion exposed from the insulating body at least on the mounting surface, said exposed portion of the heat sink defining fifth conduction leads exposed from the insulating body.

14. The electronic device of claim 13, wherein said electronic device comprises sixth conduction leads exposed from the insulating body at least on the mounting surface, and a conductive connection of the control terminals of the first and of the second chips to the sixth control leads.

15. The electronic device of claim 11, wherein said first further heat sink comprises a first conductive plate and said second further heat sink comprises a second conductive plate, said first conductive plate being enclosed in the insulating body between the first chip and a surface of the insulating body opposite to the mounting surface, said second conductive plate being enclosed in the insulating body between the second chip and the surface of the insulating body opposite to the mounting surface.

16. The device of claim 15, wherein:
said first conductive plate comprises a portion exposed from the insulating body on the surface of the insulating body opposite to the mounting surface; and
said second conductive plate comprises a portion exposed from the insulating body on the surface of the insulating body opposite to the mounting surface.

17. The electronic device of claim 9, wherein said conductive plate of the heat sink comprises a portion exposed from the insulating body on a surface of the insulating body opposite to the mounting surface.

* * * * *